United States Patent [19]

Kucera et al.

[11] Patent Number: 6,091,631
[45] Date of Patent: Jul. 18, 2000

[54] PROGRAM/VERIFY TECHNIQUE FOR MULTI-LEVEL FLASH CELLS ENABLING DIFFERENT THRESHOLD LEVELS TO BE SIMULTANEOUSLY PROGRAMMED

[75] Inventors: Joe Kucera, Austin; Joseph Skrovan, Buda, both of Tex.

[73] Assignee: Advanced Micro Devices, Inc., Sunnyvale, Calif.

[21] Appl. No.: 09/108,529

[22] Filed: Jul. 1, 1998

[51] Int. Cl.[7] .................................................. G11C 16/04
[52] U.S. Cl. ................... 365/185.03; 365/185.33
[58] Field of Search ......................... 365/185.03, 185.22, 365/185.24, 185.29, 185.33, 218

[56] References Cited

U.S. PATENT DOCUMENTS

| | | | |
|---|---|---|---|
| 5,523,972 | 6/1996 | Rashid et al. ...................... | 365/185.22 |
| 5,694,357 | 12/1997 | Mori .................................. | 365/185.03 |
| 5,768,188 | 6/1998 | Park et al. ......................... | 365/185.03 |
| 5,815,436 | 9/1998 | Tanaka et al. ..................... | 365/185.03 |
| 5,870,218 | 2/1999 | Jyouno et al. ..................... | 365/185.03 |
| 5,894,436 | 4/1999 | Ohkawa et al. ................... | 365/185.03 |
| 5,903,495 | 5/1999 | Takeuchi et al. .................. | 365/185.03 |
| 5,943,260 | 8/1999 | Hirakawa ........................... | 365/185.03 |

*Primary Examiner*—Trong Phan
*Attorney, Agent, or Firm*—Fliesler, Dubb, Meyer & Lovejoy

[57] ABSTRACT

A program/verify method for a multi-level flash memory array, wherein threshold values to be programmed into each flash memory cell are represented using binary bits. In the program/verify method for each cell, the most significant bit representing the threshold level to be programmed into a cell is read first and the cell is programmed to the minimum threshold level represented by the most significant bit. The next most significant bit is then read and if necessary further programming pulses are applied to complete programming. By programming to the level of the most significant bit first rather than programming to each possible threshold separately as determined by all bits read together, less time is required for programming an array.

5 Claims, 3 Drawing Sheets

PROGRAM/VERIFY TECHNIQUE FOR MULTI-LEVEL FLASH CELLS ENABLING DIFFERENT THRESHOLD LEVELS TO BE SIMULTANEOUSLY PROGRAMMED

BACKGROUND OF THE INVENTION

1. Field of the Invention

The present invention relates to a method for programming and verifying the programmed state for multi-level flash memory cells.

2. Description of the Related Art

Multi-level storage refers to the ability of a single memory cell to represent more than a single binary bit of data. A conventional memory cell depicts two states or levels, usually referred to as logic "0" and logic "1". A multi-level cell can represent many states.

Multi-level cell storage is obtainable in flash memory cells because a flash memory cell can be programmed to provide multiple threshold voltage (vt) levels. For example, in FIG. 1 four vt levels are shown, vt0–vt3, and a representation of the state stored by the memory cells can be provided using two binary bits labeled Q1 and Q2 as shown. Using flash memory cells, vt levels programmed can be sustained over time, even after repeated accesses to read data from the cell.

FIG. 2 shows a typical configuration for an integrated circuit including a flash memory array 200 and circuitry enabling programming, erasing, and reading or verifying the programming state for memory cells in the array 200. The flash memory array 200 is composed of individual cells, such as 202. Each cell has a drain connected to a bitline, such as 204. Each bitline is connected to a bitline pull up circuit 206 and column decoder 208. Sources of the array cells are connected to Vss, while gates are each connected by a wordline to a row decoder 210.

The row decoder 210 receives voltage signals from a power supply 212 and distributes the particular voltage signals to the wordlines as controlled by a row address received from a processor 214. Likewise, the bitline pull up circuit 206 receives voltage signals from the power supply 212 and distributes the particular voltage signals to the bitlines as controlled by a signal from the processor 214.

The column decoder 208 provides signals from particular bitlines to sense amplifiers or comparators 216 as controlled by a column address signal from processor 214. The sense amplifiers 116 further receive a voltage reference signal from reference 118 to enable reading, as described in more detail below. The outputs from sense amplifiers 216 can be provided to a page buffer 220 which has outputs connected back to processor 214. The outputs of the sense amplifiers 216 can also be connected directly back to the processor 214 if a page buffer 220 is not desired. To program a cell in the flash memory array 200, high gate-to-drain voltage pulses are provided to the cell from power supply 212 while a source of the cell is grounded. For instance, during programming typical gate voltage pulses of 10V are each applied to a cell, while a drain voltage of the cell is set to 5.5V and its source is grounded. This programming procedure results in an increase of a threshold voltage for the cell, the threshold being the gate-to-source voltage required for the cell to conduct.

To erase a cell in the flash memory array 200, relatively high negative gate-to-source voltage pulses are applied. For instance, during erase gate voltage pulses of –10V are applied to a cell, while a drain of the cell is set to 5.5V and its source is floated. The large negative gate-to-source voltage pulses reduce the threshold of the cell.

To determine if a cell is programmed or erased to a desired threshold level, a read or verify procedure is applied after each program or erase pulse. During verify, a gate or wordline voltage $WL_1$–$WL_3$ is applied to a cell as illustrated in FIG. 1 The bitline output (BL) from a cell 300 being read is received at an input of one of the sense amplifiers 302 in sense amplifiers 216, as illustrated in FIG. 3. A second input to the sense amplifier 302 is provided from the reference 218. The reference 218 provides a minimal current so that if the wordline voltage WL is greater than the vt level of a cell, the output of sense amplifier 302 will indicate a first state, and if the wordline voltage is less than the vt level of the cell, the output of sense amplifier 302 will indicate a second state. Program or erase pulses are applied with a verify procedure between each pulse until the output of sense amplifier 302 toggles to indicate a desired vt level is obtained.

To enable more rapid reading of a state stored by a memory cell, a page buffer 220 containing latches can be connected to the outputs of sense amplifiers 216, as further shown in FIG. 2, and as shown in detail in FIG. 3. The page buffer 220 reduces read time since the latches of the page buffer 220 store the memory cell state after a first read operation so that subsequent read operations involving the memory cell are not required.

FIG. 3 shows three latches 311–313 of a page buffer 220 coupled to the output of a memory cell 300. If the output of sense amplifier 302 is high, the transistor 340 will turn on and overcome current source 342 and pull down node 350. If the output of sense amplifier 302 is low, the transistor 340 will turn off and current source 342 will pull up node 350. A latch enable signal can be applied to one of transistors 331–333 to connect the node 350 to a respective one of the latches 311–313. The respective latch will then store the state of node 350.

During a verify operation, each latch enable is separately applied to transistors 331–333 depending on the level of the wordline voltage WL applied to the memory cell. For example, for a vt1 level, the latch 311 is enabled by applying an enable signal to transistor 331 and a word line voltage is applied at the $WL_1$ level as shown in FIG. 1. The latch 311 will then indicate if the threshold of the memory cell 300 is below $WL_1$ or above $WL_1$ at vt1, referring to the program states of FIG. 1. Similarly, the latch 312 is enabled using a transistor 332 when a wordline voltage at the $WL_2$ level is applied to determine if the cell is programmed to vt2, and the latch 313 is enabled using transistor 333 and a wordline voltage $WL_3$ is applied to determine if a cell is programmed to the vt3 level. The state of the latches 311–313 after applying wordline voltages $WL_1$–$WL_3$ and enabling the appropriate latches indicates the state stored by the memory cell 300.

Note that the wordline levels $WL_1$–$WL_3$ in FIG. 1 are between the vt1–vt3 levels. The hatch marks illustrate a spectrum of vt states for each of the levels vt0–vt3. During a typical program/verify procedure, after each program pulse is applied, one of the word line voltages $WL_1$–$WL_3$ is applied to a cell. When the cell conducts during a verify procedure, the cell is programmed above the desired wordline voltage to one of the levels vt1–vt3 and programming is complete. For an erase procedure, erase pulses are applied until a cell having $WL_1$ applied as a gate voltage no longer conducts indicating it has a threshold at vt0.

To program an array of cells, all cells are typically erased first. Memory cells are then programmed in an order according to a threshold level to be stored. For instance, all memory cells having a vt1 state are programmed first. Once programming is complete for all memory cells having a vt1 state, programming is performed for all cells having the vt2 state. Once programming for cells having a vt2 state is complete, all cells are programmed having a vt3 state, and so forth.

To facilitate programming, data to be stored in a memory cell can be preloaded into the page buffer latches using signals provided to the preset connection such as the prst0–prst3 connections to latches 311–313 of FIG. 3. For example, a "0" can be preset into latches where it is desired to cause the corresponding flash cell to program to a higher vt level, while a "1" is preset into the remaining latches. The cells having a latch with a "0" state will have programming pulses applied until the latch with a "0" state transitions to a "1" state. For example, loading latch 311 with 0, latch 312 with 1, and latch 313 with 1 and following the above programming procedure will cause the vt of cell 300 to be raised from the erase vt0 level to the vt1 level during programming.

SUMMARY OF THE INVENTION

The present invention provides a method for programming multi-level flash memory cells which reduces the time required for programming compared to conventional programming techniques.

The present invention further reduces the amount of circuitry needed for verifying the programming state for multi-level flash memory cells.

The present invention includes a program/verify method, wherein a most significant binary bit representing a threshold value to be programmed into a cell is read first and the cell is programmed to the minimum threshold level represented by the most significant bit. The next most significant bit is then read and further programming pulses are applied if needed to complete programming. By programming to the level of the most significant bit first, rather than programming to each possible threshold separately as determined by all bits read together, less time is required for programming an array.

With such a programming method, the present invention further includes a method of storing data during a program/verify procedure so at least two less latches than possible threshold states can be used in a page buffer for each memory cell during programming. To enable use of less latches, a latch storing the most significant bit representing a threshold value to be programmed can be reused.

For example, when three threshold levels vt1, vt2 and vt3 are used, referring to FIG. 3, the most significant bit representing the threshold level to be programmed is stored in a page buffer latch 312 and the next most significant bit is stored in a page buffer latch 311. The latch 312 is read first and the cell 300 is programmed to vt2 if latch 312 stores a 0. During the program verify procedure once the vt2 level is obtained the latch 312 will toggle to a 1. To reuse the latch 312, the latch 312 is then preset to 0, and a read is performed with the latch 312 enabled if latch 311 stores a 0, causing latch 312 to transition to a 1 if the memory cell 300 is to be programmed to a level vt3. The state of latch 312 is then inverted. A read is also performed with latch 311 enabled to enable latch 311 to transition to a 1 if the cell 300 is already programmed to vt2. If the latch 312 now stores a 0, the cell 300 is programmed to the level vt3. If the latch 311 stores a 0, the cell 300 is programmed to the level vt1. By reusing the latch 312 to represent the vt3 level in this manner, the third latch 313 is no longer required for programming.

BRIEF DESCRIPTION OF THE DRAWINGS

Further details of the present invention are explained with the help of the attached drawings in which.

DETAILED DESCRIPTION

The present invention includes a program/verify method which uses multiple binary bits to indicate the state to be programmed into each cell in an array of flash memory cells. In the program/verify method, a most significant binary bit representing a threshold value to be programmed into each cell is first read and the cells are programmed to the minimum threshold level represented by the most significant bit. The next most significant bit is then read and further programming pulses are applied if needed to complete programming.

Figure 1:
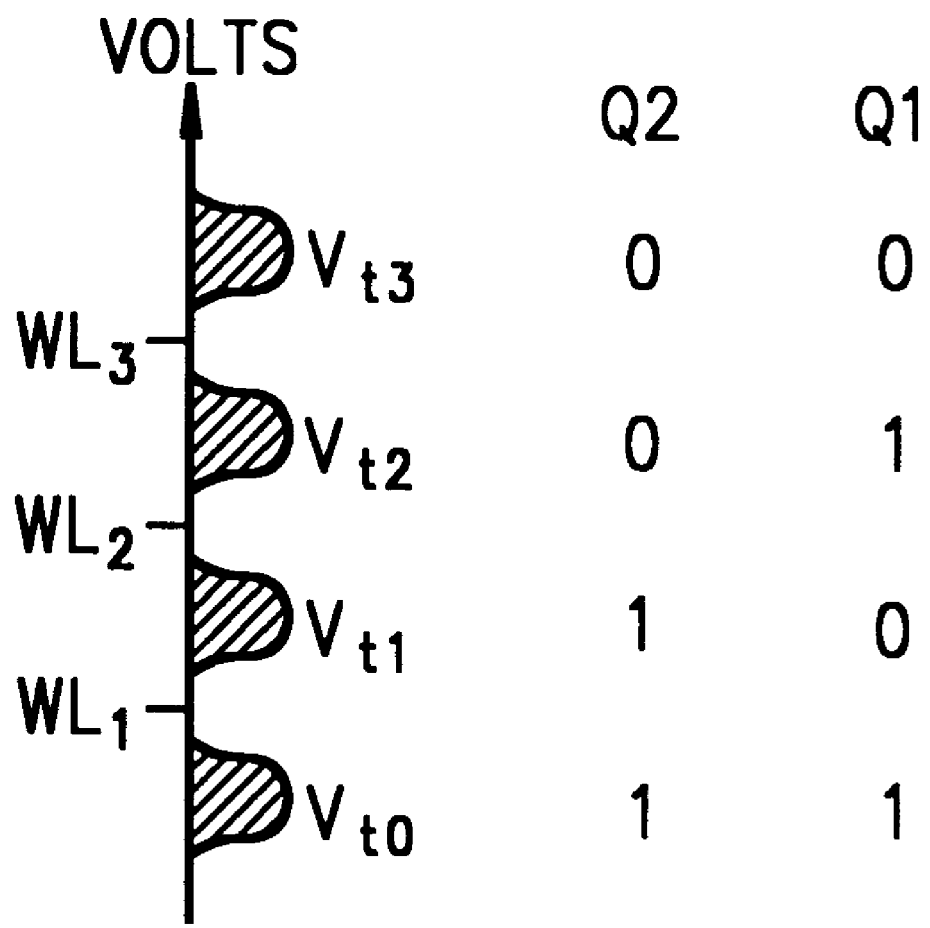
FIG. 1 shows threshold voltage levels vt0–vt3, binary values Q1–Q2 representing the threshold voltage values, and wordline values WL1–WL$_3$ used to program the thresholds.
Figure 2:
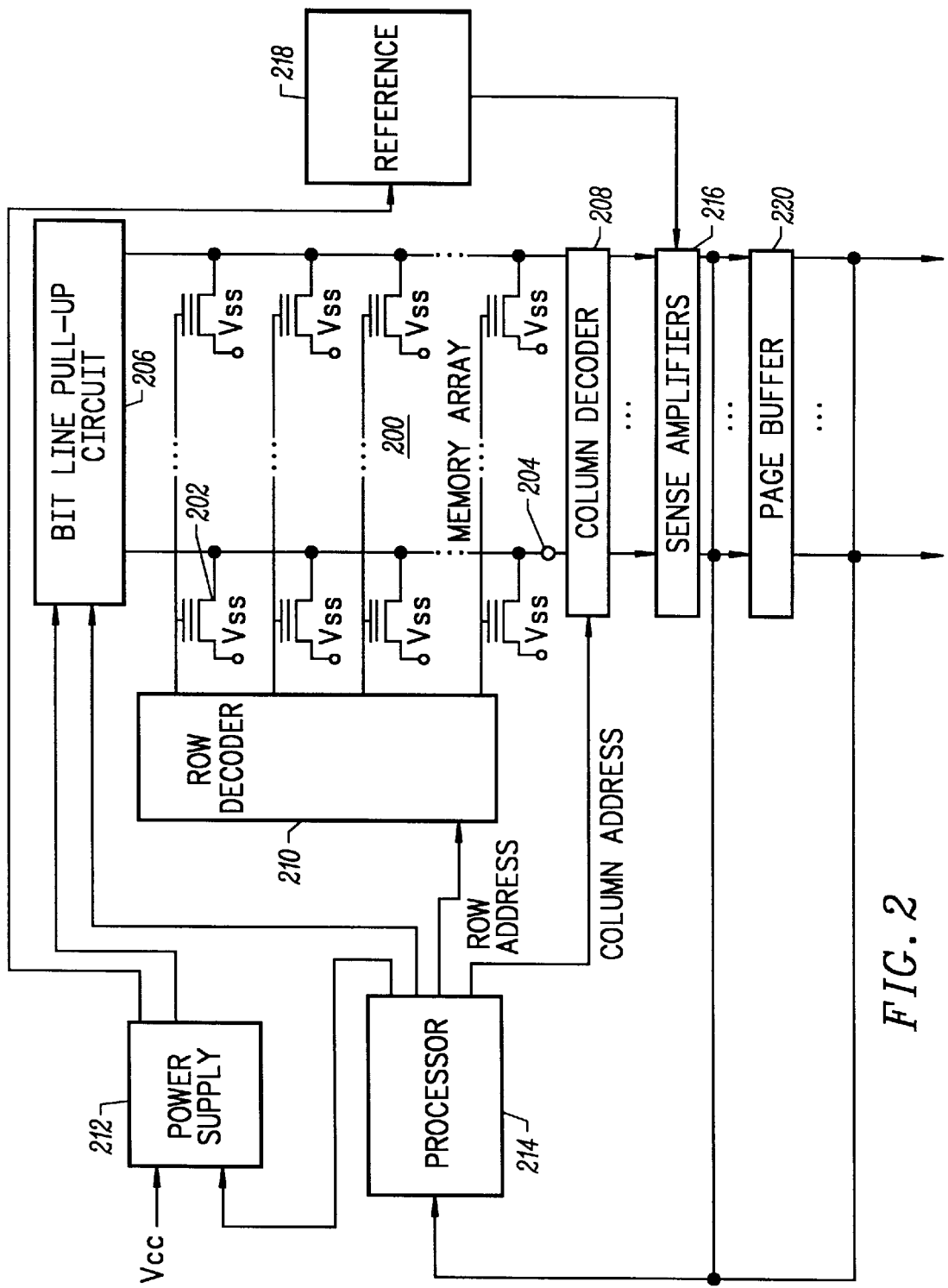
FIG. 2 shows a typical configuration for an integrated circuit including a flash memory array.

For example, with four possible vt levels vt0–vt3, as illustrated in FIG. 1, the bits Q1 and Q2 can be used to represent a desired programmed state. To begin the program/verify method of the present invention, all cells are first erased to a vt0 state. To program the cells to a desired level, the most significant binary bit Q2 will be read first for the cells. For all cells with a Q2 of 0, a program operation will be performed to raise the threshold level to vt2. Cells which are to be programmed to either the vt2 or vt3 levels are, thus, simultaneously programmed to the vt2 level.

After all cells with a Q2 of 0 are programmed to the vt2 level, the state of the binary bit Q1 in combination with the bit Q2 is used to enable programming of the remaining vt1 and vt3 levels. For instance, if both Q2 and Q1 are 0, additional programming pulses are applied to a cell to increase the cell threshold from vt2 to vt3. If Q2 is 1 and Q1 is 0, programming pulses are applied to raise a cell threshold to vt1.

With the flash memory cell storing more than four possible vt levels, more than two binary bits will be needed to represent the desired vt programming levels. With more than two binary bits, the method of the present invention can be extended by first utilizing the most significant binary bit alone to program cells, then using a second most significant bit in combination with the most significant binary bit to further program cells, and then using the third most significant bit in combination with the first and second bits and so forth.

Figure 3:
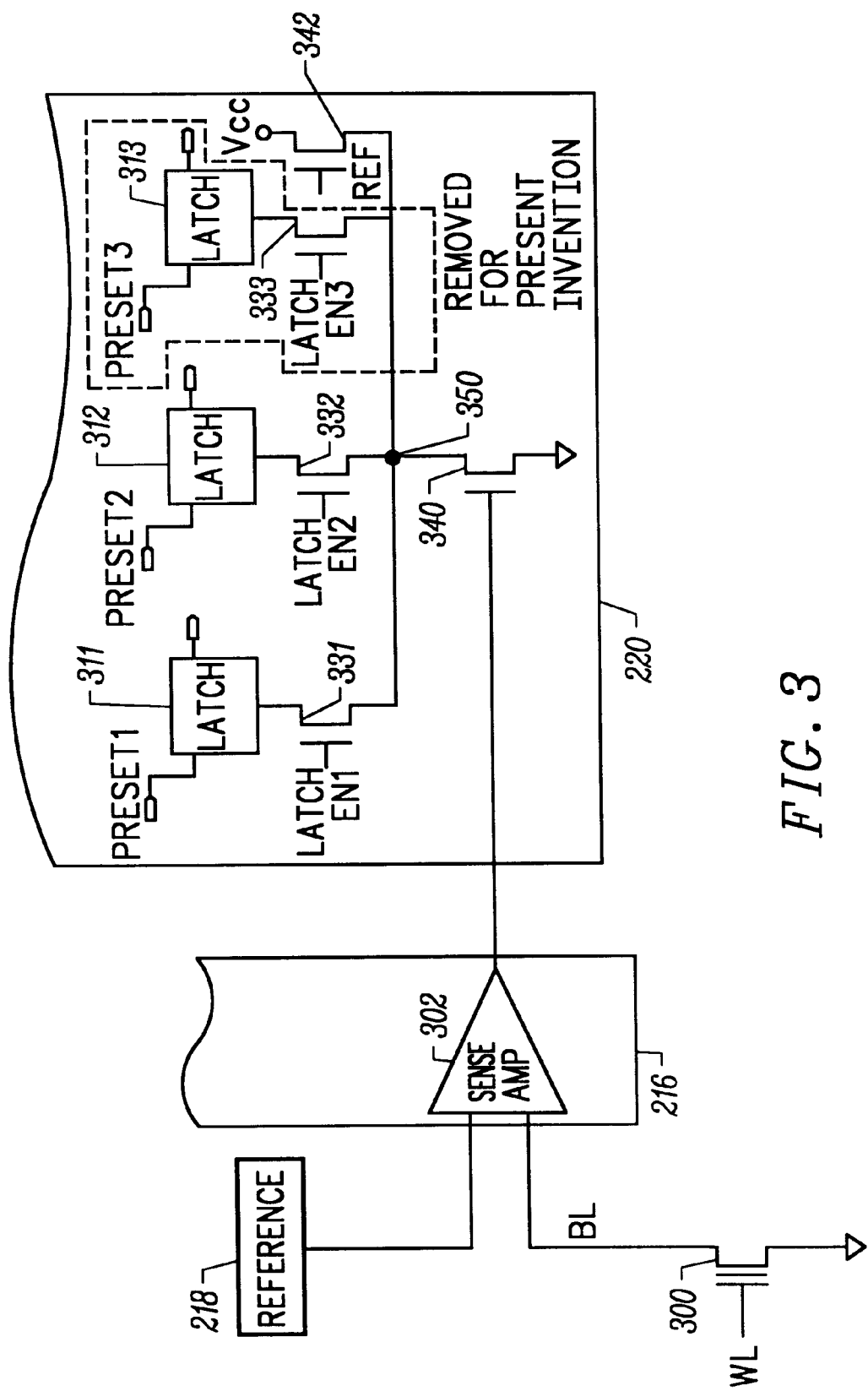
FIG. 3 shows details of the page buffer and sense amplifiers of FIG. 2.

With the programming method of the present invention as described, the present invention further includes a method of storing the binary bits representing vt programming levels in latches of a page buffer so that less latches are required than with conventional program/verify methods. For example, with memory cells storing four possible threshold levels vt0-vt3 as shown in FIG. 1, the latch 313 and latch enable transistor 333 of FIG. 3 can be removed with the program/verify method of the present invention used.

To enable use of less latches, a latch storing the most significant binary bit representing a threshold value to be programmed is reused. For example, when four threshold levels vt0–vt3 are used as illustrated in FIG. 1, referring to FIG. 3, the program/verify method of the present invention initially stores the most significant bit Q2 in latch 312 and the next most significant bit Q1 in latch 311. After all cells are erased to the vt0 level, the latch 312 state is read, and if the latch stores a 0, the cell 300 is programmed to vt2. Similarly, other pairs of latches in the page buffer are preset to represent a desired programming state for other cell and the most significant bit is read to program all cells to vt2 which have a most significant bit of 0.

Once the vt2 level is programmed into a cell, its most significant latch bit will toggle from a 0 to a 1 during a verify process so that all latches storing a most significant bit for a cell now store a 1. Thus, the page buffer data will be identical for all cells to be programmed to the vt1 and vt3 levels with a most significant latch bit being 1 and a least significant latch bit being 0. Since the latch storing the most significant bit is no longer useful, it is reused to store data needed to distinguish between the vt1 and vt3 levels. Reusing the latch storing the most significant bit enables elimination of latches such as 313 of FIG. 3 and corresponding control circuitry, significantly reducing overall page buffer circuitry.

To reuse the latches which store the most significant bit for the cells, the latches storing the most significant bit for the cells are preset to zero. Next, a read of the memory cells is performed with the latch which stored the most significant bit enabled if the corresponding latch storing the next most significant bit stores a 0 to flip the most significant bit latches to 1 if their corresponding cell is to be programmed to the vt3 level.

Programming of cells to the vt1 level can now be performed. To do so first involves a verify operation with the latches storing the next most significant bit, such as 311 of FIG. 3, enabled. All such latches connected to a cell programmed to vt2 if storing a 0 will, thus, toggle to 1. The next most significant bit latches storing a 0 now represent cells which should be programmed to vt1. A program/verify procedure can now be performed to program such cells to vt1. Once programming is complete for those cells, all least significant bit latches will store a 1.

The only cells left to deal with are those which must be programmed to a vt3 level. Note that those cells have already been programmed to the vt2 level as described earlier. The cells remaining to be programmed to the vt3 level are indicated by the most significant bit page buffer latches which store a 1. Since cells to be programmed must have a 0 data value stored in their corresponding page buffer latches, the data stored in all of the most significant bit latches is inverted. The most significant bit latch is now set to 0 for cells remaining to be programmed from vt2 up to vt3. A program/verify procedure can now be performed to program such cells to vt3. Once programming is complete, all page buffer latches will store a 1.

With more than four vt states which can be programmed into a cell, more than one latch might be reused during the program/verify procedure following a method similar to the method described above. Overall page buffer circuitry can, thus, be reduced even further with greater numbers of vt levels being storable.

In summary, the two main advantages of the present invention are faster programming times and reduced circuit overhead and complexity. Faster programming results from simultaneously programming cells which store different threshold voltages. The simultaneous programming technique reduces overall programming time compared to programming each threshold level separately. Circuit overhead and complexity are reduced as a result of reusing page buffer latches. Without such page buffer latch reuse, additional latches and control circuitry for each memory cell would be required in a page buffer to store data for vt programming levels during programming.

Although the present invention has been described above with particularity, this was merely to teach one of ordinary skill in the art how to make and use the invention. Many additional modifications will fall within the scope of the invention, as that scope is defined by the claims which follow.

What is claimed is:

1. A method of programming a multi-level flash memory cell to one of a plurality of threshold voltage (vt) levels as represented by a plurality of bits, the method comprising the steps of:

(a) erasing the cell so that the cell has a threshold set to a lowest one of the vt levels;

(b) determining if a state of a most significant one of the bits identifies a first maximum representable threshold value, and if so programming the cell to a first one of the vt levels before preceding to step (c);

(c) determining if the state of a next most significant bit identifies a second maximum representable threshold value while a state of the most significant bit identifies less than the first maximum representable threshold value, and if so programming the cell to a second one of the vt levels; and (d) determining if the state of the most significant bit along with a state of the next most significant bit identify both the first and second maximum representable threshold values, and if so programming the cell to a third one of the vt levels.

2. The method of claim 1, wherein the second vt level is less than the first vt level and the third vt level is greater than the first vt level.

3. The method of claim 1, further comprising the following steps:

storing the most significant bit in a first latch (312) and the next most significant bit in a second latch (311) prior to the step (b);

toggling the second latch (311) prior to step (c) if the most significant bit and the next most significant bit identify the third one of the vt levels, and utilizing the output of the second latch (311) to make the determination in step (c); and setting the first latch (312) after step (b) and prior to step (d) to indicate if the most significant bit and the next most significant bit represent the third one of the vt levels, and utilizing the value stored in first latch (312) to make the determination in step (d).

4. A method of programming a flash memory cell to one of threshold voltage levels vt1, vt2 or vt3 as represented by binary bits stored in a first latch (311) and a second latch (312), wherein a verify procedure utilized during programming transitions a state of at least one of the first and second latches from a 0 to a 1 when programming is complete, the method comprising the steps of:

erasing the cell so that the cell has a threshold below the threshold level vt1;

determining if the second latch (312) stores a 0 and if so programming the cell to the threshold level vt2;

toggling the second latch (312) so that the latch stores a 0 if the second latch (312) is storing a 1;

reading the cell state to cause a 1 to be stored in the second latch (312) if the cell has a voltage level greater than the threshold level vt2 and the first latch (311) stores a 1;

reading the cell state to cause a 1 to be stored in the first latch (311) if the cell has a voltage level greater than the threshold level vt2;

inverting the state stored by the second latch (312);

determining if the second latch (312) stores a 0 and if so further programming the cell to the threshold level vt3; and determining if the first latch (311) stores a 0 and if so programming the cell to the threshold level vt1.

5. The method of claim 4, wherein the threshold level vt3 is greater than the threshold level vt2, and the threshold level vt2 is greater than the threshold level vt1.

* * * * *